United States Patent [19]
Takeuchi

[11] Patent Number: 5,521,948
[45] Date of Patent: May 28, 1996

[54] FREQUENCY SYNTHESIZER

[75] Inventor: Isao Takeuchi, Tokyo, Japan

[73] Assignee: Sony Corporation, Tokyo, Japan

[21] Appl. No.: 426,730

[22] Filed: Apr. 21, 1995

[30] Foreign Application Priority Data

Apr. 28, 1994 [JP] Japan ................................. 6-092558

[51] Int. Cl.⁶ ..................................................... H03D 3/24
[52] U.S. Cl. ............................... 375/376; 331/11; 331/18
[58] Field of Search ........................... 375/376; 331/1 A, 331/2, 16, 25, 11, 18, 1 R; 455/165.1, 183.1, 260; 327/147, 156

[56] References Cited

U.S. PATENT DOCUMENTS

| | | | |
|---|---|---|---|
| 4,888,564 | 12/1989 | Ishigaki | 331/1 A |
| 4,970,473 | 11/1990 | Lietar | 331/1 A |
| 5,038,117 | 8/1991 | Miller | 331/16 |
| 5,256,981 | 10/1993 | Fountain | 328/14 |
| 5,365,202 | 11/1994 | Mori | 331/12 |

Primary Examiner—Stephen Chin
Assistant Examiner—Don Vo
Attorney, Agent, or Firm—Jay H. Maioli

[57] ABSTRACT

A frequency synthesizer includes a voltage-controlled oscillator, frequency dividing circuits, a signal source, phase comparing circuits, an adding circuit, a converting circuit and a control circuit. The frequency dividing circuits divide an output supplied thereto from the voltage-controlled oscillator with frequency-dividing ratios of 1/N and 1/(N+1) where N is an arbitrary integer. The signal source outputs a reference frequency signal. The phase comparing circuits phase-compare a signal divided by N supplied thereto from one frequency dividing circuit and a signal divided by (N+1) supplied thereto from another frequency dividing circuit and the reference frequency signal from the signal source. The adding circuit adds a signal which results from phase-comparing the reference frequency signal output from the phase comparing circuit and the signal divided by N and a signal which results from phase-comparing the reference frequency signal output from the phase comparing circuit and the signal divided by (N+1). The converting circuit converts an output from the adding circuit to a DC signal and supplies the same to the voltage-controlled oscillator. The control circuit controls frequency-dividing ratios of the frequency dividing circuits. The control circuit cyclically changes the frequency-dividing ratios of the frequency dividing circuits to 1/N or 1/(N+1).

6 Claims, 6 Drawing Sheets

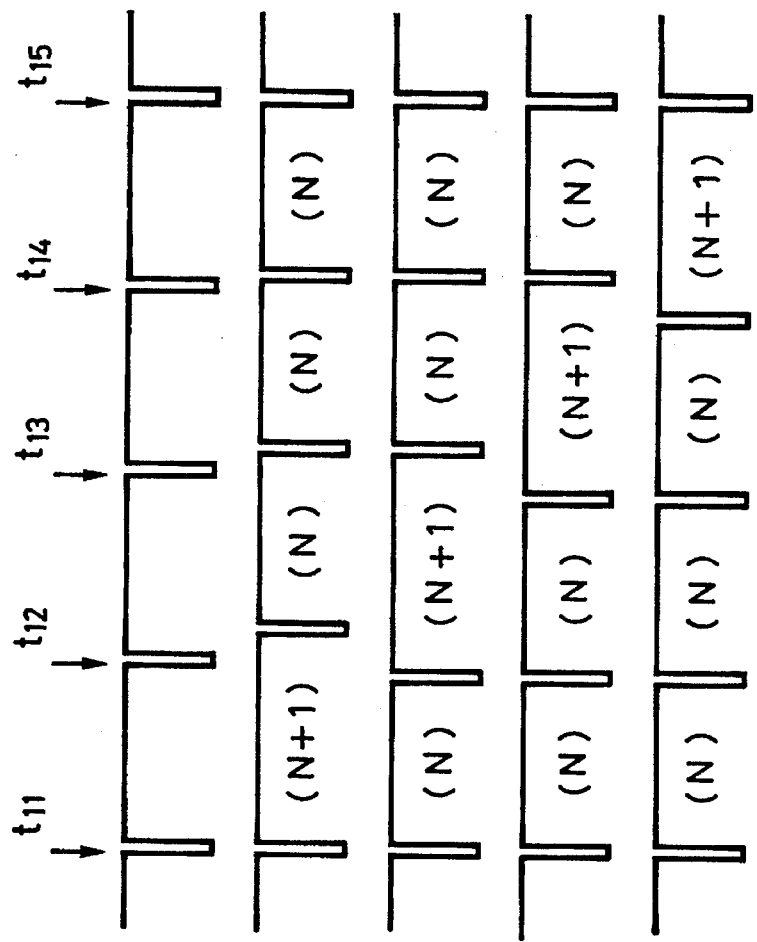
FIGURE 6A  Reference Oscillation Output
FIGURE 6B  Output of Frequency Divider 26
FIGURE 6C  Output of Frequency Divider 27
FIGURE 6D  Output of Frequency Divider 28
FIGURE 6E  Output of Frequency Divider 29

FREQUENCY SYNTHESIZER

BACKGROUND

1. Field of the Invention

The present invention relates to a frequency synthesizer and, particularly to a frequency synthesizer formed of a phase locked loop (PLL) circuit.

2. Background of the Invention

Frequency synthesizers formed of a PLL circuit generate and output a signal having a frequency of an integral multiple of a reference frequency signal output from a reference oscillator. There have hitherto been developed frequency synthesizers that can change a frequency at an interval smaller than the integral multiple.

FIG. 1 of the accompanying drawings shows an example of such frequency synthesizer. This frequency synthesizer is a fractional-N system and supplies a reference frequency signal output from a reference oscillator 1 to a phase comparator 2.

The phase comparator 2 detects a phase difference between a frequency-divided signal output from a frequency divider 7, which will be described later on, and the reference frequency signal. The phase comparator 2 supplies an error signal based on the detected phase difference to an adder 3. The adder 3 adds an interpolation signal output from an automatic phase interpolating circuit 9, which will be described later on, to the error signal supplied thereto from the phase comparator 2. The adder 3 supplies a resulting added error signal to a low-pass filter (LPF) 4. The LPF 4 converts the error signal to a DC error signal. The LPF 4 supplies a resulting DC error signal to a voltage-controlled oscillator (VCO) 5 as a control signal. The VCO 5 supplies an oscillation signal to a frequency signal output terminal 6, the frequency divider 7 and a control unit 8.

The frequency divider 7 divides the oscillation output from the VCO 5. The frequency divider 7 alternately switches a frequency-dividing ratio to a predetermined value 1/N (N is an integer) or 1/(N+1) under the control of the control unit 8. The frequency divider 7 supplies a frequency-divided signal to the phase comparator 2. The control unit 8 controls the automatic phase interpolating circuit 9 such that the automatic phase interpolating circuit 9 outputs an interpolation signal at every predetermined period.

An operation of the frequency synthesizer will be described with reference to timing charts of FIGS. 2A to 2C. Assuming that the reference oscillator 1 outputs a reference frequency signal of a period shown in FIG. 2A, then the frequency divider 7 has a frequency-dividing ratio of 1/N at a certain timing $t_a$ of the reference frequency signal as shown in FIG. 2B. The frequency divider 7 changes the frequency-dividing ratio of 1/N to 1/(N+1) when the reference frequency signal is advanced from the timing $t_a$ to a timing $t_b$. Further, the frequency divider 7 resets the frequency-dividing ratio of 1/(N+1) to 1/N when the reference frequency signal is advanced from the timing $t_b$ to a timing $t_c$. Therefore, the frequency divider 7 repeats the switching of the frequency-dividing ratios of 1(N+1) and 1/N at every period.

When the frequency-dividing ratios are set as described above, the phase comparator 2 detects a predetermined phase error $\phi_1$ at a timing point where the frequency-dividing ratio is switched from 1/N to 1/(N+1) at every two periods of the reference frequency signal as shown in FIG. 2C. As a consequence, the oscillation frequency of the VCO 5 is disturbed.

In the frequency synthesizer shown in FIG. 1, the automatic phase interpolating circuit 9 outputs an interpolation signal for interpolating the phase error $\phi_1$ at every two periods of the reference frequency signal. Then, the adder 3 adds the interpolation signal to the phase error signal to cancel the phase error $\phi_1$ out so that the VCO 5 outputs a stable oscillation output.

Therefore, the VCO 5 can output a frequency signal having a frequency (N+0.5) times the frequency of the reference frequency signal. Thus, the frequency synthesizer can change the frequency at an interval smaller than the integral multiple.

In the case of the frequency synthesizer shown in FIG. 1, however, the automatic phase interpolating circuit 9 and peripheral circuits become complicated in arrangement. Specifically, the automatic phase interpolating circuit 9 is formed as a digital-to-analog (D/A) converter for converting digital control data to data of analog level. Thus, the arrangement of the automatic phase interpolating circuit 9 is complicated. Therefore, if the frequency synthesizer includes the automatic phase interpolating circuit, then the PLL circuit becomes complex in arrangement.

SUMMARY OF THE INVENTION

It is therefore an object of the present invention to provide a frequency synthesizer in which the aforesaid problems can be solved.

According to the present invention, there is provided a frequency synthesizer which includes a voltage-controlled oscillator, frequency dividing circuits, a signal source, phase comparing circuits, an adding circuit, a converting circuit and a control circuit. The frequency dividing circuits divide an output supplied thereto from the voltage-controlled oscillator with frequency-dividing ratios of 1/N and 1/(N+1) where N is an arbitrary integer. The signal source outputs a reference frequency signal. The phase comparing circuits phase-compare a signal divided by the N supplied thereto from the frequency dividing circuit and a signal divided by the (N+1) supplied thereto from the frequency dividing circuit and the reference frequency signal from the signal source. The adding circuit adds a signal which results from phase-comparing the reference frequency signal output from the phase comparing circuit and the signal divided by N and a signal which results from phase-comparing the reference frequency signal output from the phase comparing circuit and the signal divided by (N+1). The converting circuit converts an output from the adding circuit to a DC signal and supplies the same to the voltage-controlled oscillator. The control circuit controls frequency-dividing ratios of the frequency dividing circuits. The control circuit cyclically changes the frequency-dividing ratios of the frequency dividing circuits to 1/N or 1/(N+1).

According to the present invention, since the frequency-dividing ratios of the frequency dividing circuits are cyclically at different times, phase differences between the frequency-divided signals and the reference frequency signal are changed cyclically. Average phase errors can be made equal by adding the results obtained when the frequency-divided signals are phase-compared with the reference signal. As a consequence, the voltage-controlled oscillator can be controlled in a stable state and the oscillation output of the voltage-controlled oscillator can be controlled by the combined frequency-dividing ratios of 1/N and 1/(N+1) of the frequency dividing circuits.

BRIEF DESCRIPTION OF THE DRAWINGS

FIGS. 6A to 6E are timing charts used to explain an operation of the frequency synthesizer according to the second embodiment of the present invention.

DESCRIPTION OF THE INVENTION

A frequency synthesizer according to the present invention will be described in detail with reference to the drawings.

Figure 1:
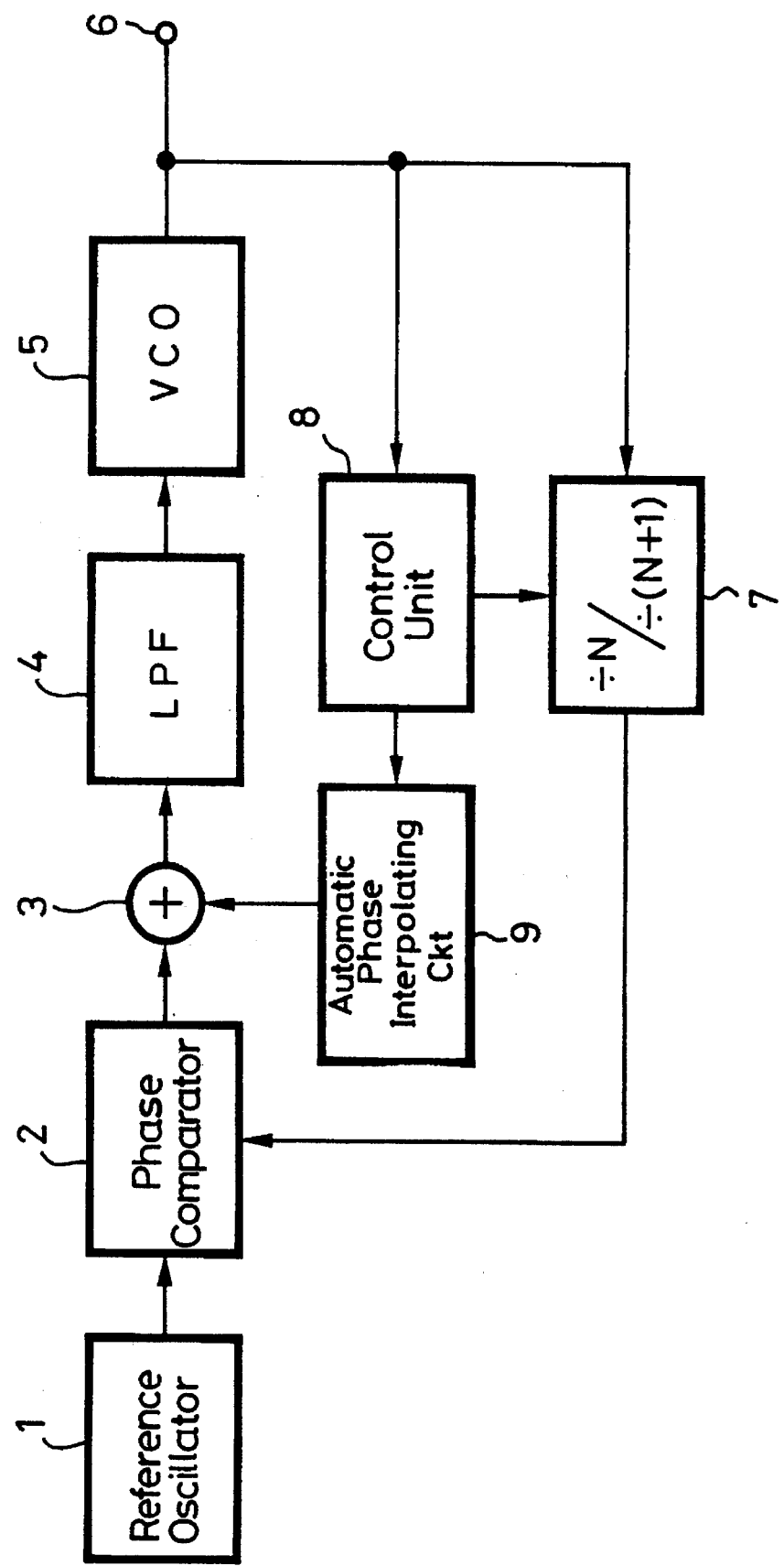
FIG. 1 is a block diagram showing an example of an arrangement of a frequency synthesizer.
Figure 2:
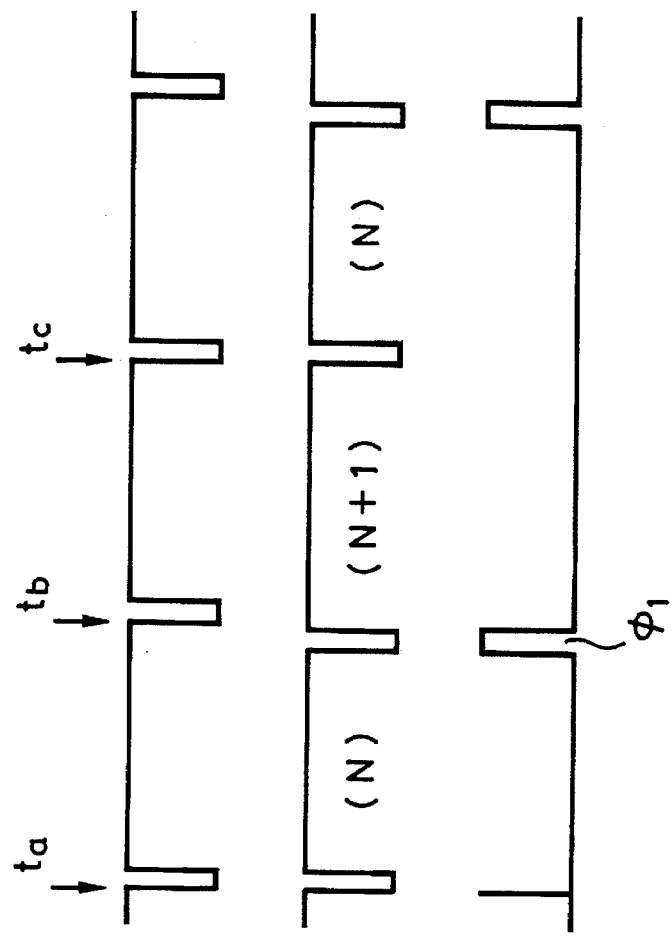
FIGS. 2A to 2C are timing charts used to explain an operation of the frequency synthesizer shown in FIG. 1.

Initially, a frequency synthesizer according to a first embodiment of the present invention will be described below with reference to FIG. 3 and FIGS. 4A through 4C. In FIG. 3 and FIGS. 4A through 4C, elements and parts identical to those of FIG. 1 are marked with the same references and therefore need not be described in detail.

Figure 3:
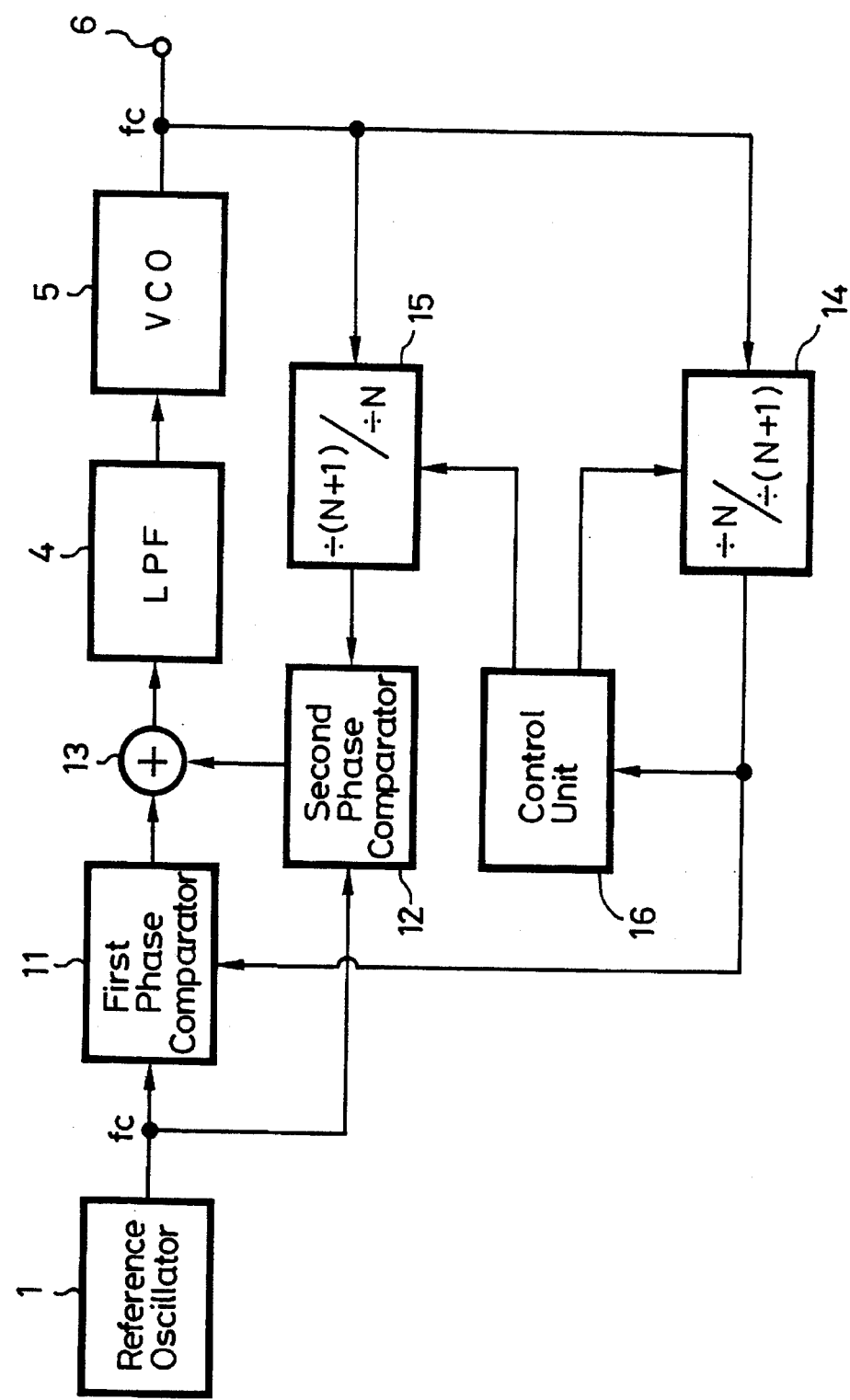
FIG. 3 is a block diagram showing a frequency synthesizer according to a first embodiment of the present invention.

FIG. 3 is a block diagram showing an arrangement of a frequency synthesizer according to a first embodiment of the present invention.

As shown in FIG. 3, the reference oscillator 1 outputs and supplies a reference frequency signal $f_r$ to first and second phase comparators 11, 12. The reference frequency signal $f_r$ has a frequency of 600 kHz. The first comparator 11 detects a phase error signal between a frequency-divided signal of a first frequency divider 14, which will be described later on, and the reference frequency signal. The second phase comparator 12 detects a phase error between a frequency-divided signal of a second frequency divider 15, which will be described later on, and the reference frequency signal.

An adder 13 adds the phase error signals output from the two phase comparators 11, 12. The adder 13 supplies a resulting added phase error signal through the LPF 4 to the VCO 5 as a control signal. The VCO 5 supplies an oscillation output $f_c$ to the frequency signal output terminal 6 and the first and second frequency dividers 14, 15.

The first and second frequency dividers 14, 15 switch a frequency-dividing ratio between 1/N and 1/(N+1) (i.e., 1/2744 and 1/2745) at every predetermined period. The first and second frequency dividers 14, 15 switch the frequency-dividing ratios under the control of a control unit 16.

The first frequency divider 14 supplies a frequency-divided output to the first phase comparator 14 and the control unit 16. The second frequency divider 15 supplies a frequency-divided output to the second phase comparator 12. The control unit 16 switches the frequency-dividing ratios of the first and second frequency dividers 14, 15 in response to every period of the frequency-divided output of the first frequency divider 14. In this case, when the frequency-dividing ratio of the first frequency divider 14 is set to 1/2744, the frequency-dividing ratio of the second frequency divider 15 is set to 1/2745 and vice versa.

An operation of the frequency synthesizer according to the first embodiment of the present invention will be described with reference to FIGS. 4A to 4C.

Figure 4:
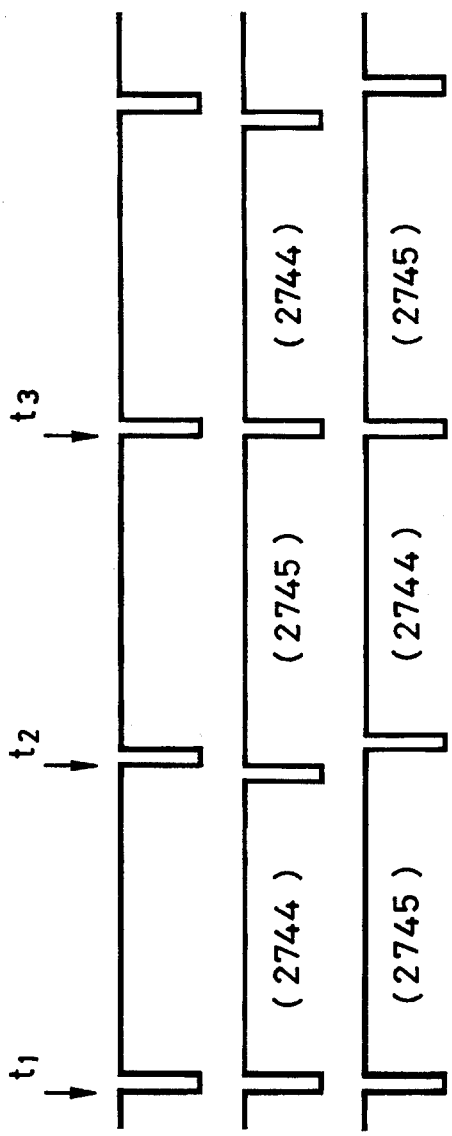
FIGS. 4A to 4C are timing charts used to explain an operation of the frequency synthesizer shown in FIG. 3.

Assuming that the reference oscillator 1 outputs the reference frequency signal with frequency of 600 kHz at a time shown in FIG. 4A, then the frequency-dividing ratio of the first frequency divider 14 is set to 1/2744 at a certain time $t_1$ of the reference frequency signal as shown in FIG. 4B and the frequency-dividing ratio of the second frequency divider 15 is set to 1/2745 at a certain time $t_1$ of the reference frequency signal as shown in FIG. 4C. The VCO 5 outputs an oscillation frequency of 1.6 GHz.

When the first and second frequency dividers 14, 15 are energized under this condition, the first frequency divider 14 outputs a frequency-divided output pulse at a timing a little before a time $t_2$ advanced from the timing $t_1$ of the reference frequency signal by one period as shown in FIG. 4B, i.e., at a time earlier than the time $t_2$ by 0.3 nanosecond. A duration of 0.3 nanosecond corresponds to a half period of 1.6 GHz. The second frequency divider 15 outputs a frequency-divided output pulse a little after the time $t_2$ advanced from the time $t_1$ of the reference frequency signal as shown in FIG. 4C, i.e., later than the time $t_2$ by 0.3 nanosecond. That is, the second frequency divider 15 outputs the frequency-divided output pulse during a period of time corresponding to a half period of 1.6 GHz.

The first phase comparator 11 detects a phase difference signal between the frequency-divided output pulse of the first frequency divider 14 and the reference frequency signal. The second phase comparator 12 detects a phase difference signal between the frequency-divided output pulse of the second frequency divider 15 and the reference frequency signal. The first and second phase comparators 11 and 12 detect corresponding phase difference signals (i.e., phase difference signals equivalent to a difference of duration of 0.3 nanosecond), respectively. The phase difference signals are the phase difference signal advanced from the reference frequency signal by 0.3 nanosecond and the phase difference signal delayed from the reference frequency signal by 0.3 nanosecond. Therefore, the adder 13 adds the above two phase error signals to output a phase error signal whose phase difference is canceled out.

Accordingly, the adder 13 supplies a phase error signal with phase difference canceled out through the LPF 4 to the VCO 5. Then, the VCO 5 can continuously output a stable oscillation output.

When the first frequency divider 14 outputs a frequency-divided output pulse, then the first frequency divider 14 switches the frequency-dividing ratio to 1/2745 under the control of the control unit 16 as shown in FIG. 4B. The second frequency divider 15 also switches the frequency-dividing ratio to 1/2744 under the control of the control unit 16 as shown in FIG. 4B. As a result, at a time $t_3$ delayed from the time $t_2$ of the reference frequency signal by one period, the first comparator 11 detects no phase difference between the frequency-divided output pulse of the first frequency divider 14 and the reference frequency signal. Also, the second phase comparator 12 detects no phase difference between the frequency-divided output pulse of the second frequency divider 15 and the reference frequency signal. Specifically, the time period after the first frequency divider 14 outputs the frequency-divided output pulse at a time a little before the time up until the time $t_3$ $t_2$ is longer than one period of the reference frequency signal by 0.3 nanosecond. This time period is equivalent to the period required for the first frequency divider 14 two divides the oscillation frequency of 1.6 GHz with the frequency-dividing ratio of 1/2745. The time period after the second frequency divider 15 outputs the frequency-divided output pulse at a kind a little after the time $t_2$ is shorter than one period of the reference frequency signal by 0.3 nanosecond. This time period is equivalent to the period required for the second frequency divider 15 to divide the oscillation frequency of 1.6 GHz with the frequency-dividing ratio of 1/2744.

Accordingly, the phase differences detected by the first and second phase comparators 11, 12 at the time $t_3$ are zero. Therefore, when the adder 13 adds the two phase error signals, the adder 13 outputs the phase error signal with a phase difference canceled. Thus, the phase error signal of phase difference zero is supplied to the VCO 5. A processing from time $t_1$ to time $t_3$ will be repeated hereinafter.

Consequently, the VCO 5 outputs the same signal as the oscillation output obtained when the frequency-dividing ratio is 1/2744.5. Then, a frequency signal (about 1.6 GHz) obtained when the frequency-dividing ratio is 1/2744.5 is output from the output terminal 6. Under the condition that the loop of this circuit is stabilized, and the oscillation frequency of the VCO 5 becomes precisely 1646.7 MHz.

The frequency synthesizer thus arranged can output a frequency signal having a frequency (integer+0.5) times the frequency of the reference frequency signal. A circuit arrangement of the inventive frequency synthesizer can be simplified because the phase error signal need not be interpolated unlike the frequency synthesizer shown in FIG. 1. Further, in the frequency synthesizer shown in FIG. 3, under the condition that the loop circuit is stabilized, the phase error signal supplied to the VCO 5 has a constant phase difference of zero. Thus, the loop circuit can oscillate stably.

Since the inventive frequency synthesizer can output the frequency signal having the frequency (integer+0.5) times the frequency of the reference frequency signal, the frequency of the reference oscillation signal can be raised high enough to obtain a signal of a desired frequency. Moreover, it is possible to reduce the time required until the loop circuit becomes stabilized. Further, since the frequency of the reference oscillation signal can be increased, a spurious signal caused by the reference oscillation signal can be attenuated with ease by the LPF 4. Therefore, it is possible to eliminate a bad influence exerted by the spurious signal.

Figure 5:
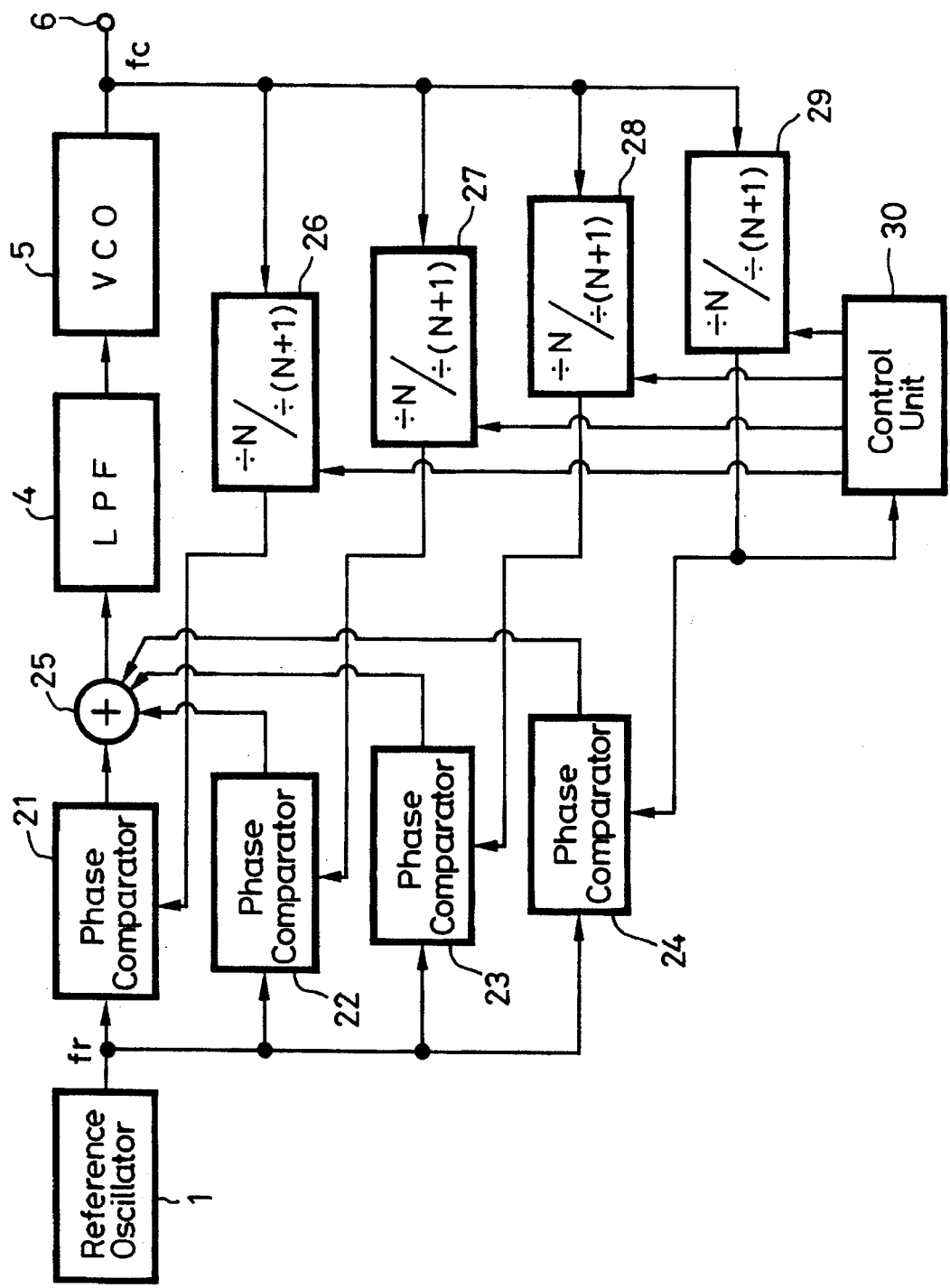
FIG. 5 is a block diagram showing a frequency synthesizer according to a second embodiment of the present invention.

A frequency synthesizer according to a second embodiment of the present invention will be described below with reference to FIG. 5 and FIGS. 6A through 6E. In FIG. 5, like parts corresponding to those of FIG. 1 are marked with the same references and therefore need not be described in detail. According to the second embodiment of the present invention, the frequency synthesizer can output a frequency signal having a frequency (integer+0.25) times the frequency of the reference frequency signal.

As shown in FIG. 5, the reference oscillator 1 outputs and supplies the reference oscillation signal $f_r$ to first, second, third and fourth phase comparators 21, 22, 23, 24. The first phase comparator 21 phase-compares the reference oscillation signal and a frequency-divided signal of a first frequency divider 26; the second phase comparator 22 phase-compares the reference oscillation signal and a frequency-divided signal of the second frequency divider 27; the third phase comparator 23 phase-compares the reference oscillation signal and a frequency-divided signal of the third frequency divider 28; and the fourth phase comparator 24 phase-compares the reference oscillation signal and a frequency-divided signal of a fourth frequency divider 29.

Phase error signals of the first, second, third and fourth phase comparators 21, 22, 23 and 24 are supplied to and added by an adder 25. The adder 25 supplies a resulting added output through the LPF 4 to the VCO 5. The VCO 5 supplies the oscillation output $f_c$ to the frequency signal output terminal 6 and the first, second, third and fourth frequency dividers 26, 27, 28 and 29. The four frequency dividers 26, 27, 28, 29 switch the frequency-dividing ratio between 1/N and 1/(N+1) at every predetermined period, where N is an integer. Each of the frequency dividers 26, 27, 28, 29 switches the frequency-dividing ratio under the control of a control unit 30.

The first, second, third and fourth frequency dividers 26, 27, 28 and 29 supply the frequency-divided signals to the first, second, third and fourth phase comparators 21, 22, 23 and 24, in which these frequency-divided signals are phase-compared with the reference frequency signals. The fourth frequency divider 29 supplies the frequency-divided signal to the control unit 30. The control unit 30 controls the frequency-dividing ratios of the frequency dividers 26 through 29. Assuming that one period represents an interval in which an output pulse is supplied as the frequency-divided signal, then the control unit 30 sets the frequency-dividing ratios of the frequency dividers 26 through 29 to 1/(N+1) once per 4 periods. Further, the control unit 30 sets the frequency-dividing ratios of the frequency dividers 26 through 29 to 1/N during other periods. The control unit 30, however, sets the frequency-dividing ratios of the frequency dividers 26 through 29 to 1/(N+1) at different times.

An operation of the frequency synthesizer thus arranged will be described with reference to FIGS. 6A to 6E. When the reference oscillator 1 output the reference frequency signal at the period shown in FIG. 6A, times of the frequency-divided output pulses of the frequency dividers 26, 27, 28, 29 are agreed at a certain time $t_{11}$ of the reference frequency signal as shown in FIGS. 6B, 6C, 6D and 6E. At the time $t_{11}$, phase error signals of the phase comparators 21 to 24 are zero.

During a first period from the time $t_{11}$ (near a time $t_{12}$ and until the frequency-divided pulse is output), the frequency-dividing ratio of the first frequency divider 26 is set to 1/(N+1) and the frequency-dividing ratios of the remaining frequency dividers 27, 28, 29 are set to 1/N as shown in FIG. 6B. During the next one period (near a time $t_{13}$ and until the frequency-divided pulse is output), the frequency-dividing ratio of the second frequency divider 27 is set to 1/(N+1) and the frequency-dividing ratios of the remaining frequency dividers 26, 28, 29 are set to 1/N as shown in FIG. 6C. During the next period (near a time $t_{14}$ and until the frequency-divided pulse is output), the frequency-dividing ratio of the third frequency divider 28 is set to 1/(N+1) and the frequency-dividing ratios of the remaining frequency dividers 26, 27, 29 are set to 1/N as shown in FIG. 6D. During the next one period (until a time $t_{15}$), the frequency-dividing ratio of the fourth frequency divider 29 is set to 1/(N+1) and frequency-dividing ratios of the remaining frequency dividers 26, 27, 28 are set to 1/N as shown in FIG. 6E.

Inasmuch as the frequency-dividing ratios of the four frequency dividers 26 to 29 are changed sequentially, at the time $t_{15}$ in which four periods had been elapsed, the frequency-divided output pulses from the frequency dividers 26 to 29 are the same phase and the phase errors can be canceled out. The phase errors obtained during the four periods from the time $t_{11}$ to the times $t_{12}$, $t_{13}$, $t_{14}$ are the same with those of the timings $t_{12}$, $t_{13}$, $t_{14}$ because one frequency divider divides the oscillation signal with the frequency-dividing ratio of 1/(N+1) and the remaining three frequency dividers divide the oscillation signal with the frequency-dividing ratio of 1/N and the adder 25 adds the phase error signals. Thus, the phase errors are canceled out. Accordingly, the phase errors are canceled out at each cycle and the loop circuit is stabilized.

According to this embodiment, since the frequency-dividing ratio is shifted by 1 at every four periods, the frequency synthesizer can generate a frequency signal having a frequency (integer+0.25) times the frequency of the reference frequency signal. The frequency synthesizer shown in FIG. 5 also can achieve the effects similar to those of the frequency synthesizer shown in FIG. 3.

While the frequency synthesizer can generate a frequency signal having a frequency (integer+0.5) or (integer+ 0.25) times the frequency of the reference frequency signal in accordance with the two embodiments described above, the present invention is not limited thereto and the inventive frequency synthesizer can generate frequency signal having a frequency of a multiple having other decimal points. Specifically, there are provided frequency dividers whose frequency-dividing ratios are switched and phase comparators of the number corresponding to the decimal point so that phase error is reduced at every period by averaging.

Furthermore, the frequencies and the frequency-dividing ratios in the aforesaid embodiments are described by way of example and can be freely changed.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A frequency synthesizer comprising:
voltage-controlled oscillating means;
frequency-dividing means for dividing an output from said voltage-controlled oscillating means with a frequency-dividing ratio of 1/N and with a frequency-dividing ratio of 1/(N+1) for providing at least two frequency divided output signals, where N is an arbitrary integer;
a signal source for outputting a reference frequency signal;
phase comparing means for phase-comparing said frequency divided output signals having said frequency-dividing ratios of 1/N and 1(N+1) from said frequency-dividing means and said reference frequency signal supplied thereto from said signal source;
adding means for adding a first signal from said phase comparing means resulting from phase-comparing said reference frequency signal and said signal frequency-divided by said frequency-dividing ratio of 1/N and a second signal from said phase comparing means resulting from phase-comparing said reference frequency signal and said signal frequency-divided by said frequency-dividing ratio of 1/(N+1);
converting means for converting an output from said adding means and supplying a DC output for controlling said voltage-controlled oscillating means; and
control means receiving one of said at least two frequency divided output signals for controlling said frequency-dividing ratios of said frequency-dividing means, wherein said control means changes said frequency-dividing ratio of said frequency-dividing means to 1/N or 1/(N+1) cyclically and on an alternating basis.

2. A frequency synthesizer according to claim 1, wherein said frequency dividing means includes at least two frequency dividers each for dividing an input signal by said frequency-dividing ratios of 1/N and 1/(N+1) and said control means switches said frequency-dividing ratio to 1/N or 1/(N+1) based on an output signal from one of said two frequency dividers.

3. A frequency synthesizer according to claim 2, wherein said phase comparing means includes at least two phase comparators supplied with said reference frequency signal from said signal source for phase-comparing said frequency divided output signals from said two frequency dividers and said reference frequency signal from said signal source, and wherein output signals from said at least two phase comparators are supplied to said adding means.

4. A frequency synthesizer according to claim 1, wherein said frequency dividing means includes first and second frequency dividers each for dividing an input signal with said frequency-dividing ratios of 1/N and 1/(N+1), and wherein said control means controls said first frequency divider such that said frequency-dividing ratio of said first frequency divider is cyclically changed to 1/N and 1/(N+1) and controls said second frequency divider such that said frequency-dividing ratio of said second frequency divider is cyclically changed to 1/(N+1) and 1/N, whereby said voltage-controlled oscillating means outputs a frequency signal based on a frequency-dividing ratio of (N+0.5) times the frequency of said reference frequency signal.

5. A frequency synthesizer according to claim 1, wherein said frequency dividing means includes first, second, third and fourth frequency dividers each for dividing a respective input signal with said frequency-dividing ratios of 1/N and 1/(N+1) and sets frequency-dividing ratios of other meaning frequency dividers to 1/N cyclically, whereby said voltage-controlled oscillating means outputs a frequency signal based on a frequency-dividing ratio of (N+0.25) times the frequency of said reference frequency signal.

6. A frequency synthesizer according to claim 1, wherein said converting means is formed of a low-pass filter.

* * * * *